United States Patent [19]

Bonneau, Jr. et al.

[11] Patent Number: 5,701,507
[45] Date of Patent: Dec. 23, 1997

[54] ARCHITECTURE OF A CHIP HAVING MULTIPLE PROCESSORS AND MULTIPLE MEMORIES

[75] Inventors: Walt C. Bonneau, Jr.; Karl Guttag, both of Missouri City; Robert Gove, Dallas, all of Tex.

[73] Assignee: Texas Instruments Incorporated, Dallas, Tex.

[21] Appl. No.: 475,272

[22] Filed: Jun. 7, 1995

Related U.S. Application Data

[63] Continuation of Ser. No. 274,132, Jul. 12, 1994, which is a continuation of Ser. No. 813,857, Dec. 26, 1991, abandoned.
[51] Int. Cl.$^6$ .................................................. H01L 21/70
[52] U.S. Cl. .................... 395/800; 395/312; 364/491; 437/51
[58] Field of Search ................... 370/58.1; 437/51, 437/54; 395/312, 800; 364/488–491

[56] References Cited

U.S. PATENT DOCUMENTS

| | | | |
|---|---|---|---|
| 4,398,248 | 8/1983 | Hsia et al. | 365/230.03 |
| 4,447,881 | 5/1984 | Brantingham et al. | 364/488 |
| 4,968,977 | 11/1990 | Chinnaswamy et al. | 340/825.8 |
| 4,978,633 | 12/1990 | Seefeldt et al. | 437/51 |
| 5,226,125 | 7/1993 | Balmer et al. | 395/312 |
| 5,369,596 | 11/1994 | Tokumaru | 364/491 |

*Primary Examiner*—Jack B. Harvey
*Assistant Examiner*—Paul R. Myers
*Attorney, Agent, or Firm*—Robert D. Marshall, Jr.; James C. Kesterson; Richard L. Donaldson

[57] ABSTRACT

A method of manufacturing integrated circuits uses an architecture having multiple processors and multiple memories, such that there is at least first and second groups of processors and memories. The first group has at least a first processor and at least a first memory. The second group has at least a second processor and at least a second memory. Regardless of where the architecture is sliced, the integrated circuits have a majority of the same address and data pin-outs.

9 Claims, 6 Drawing Sheets

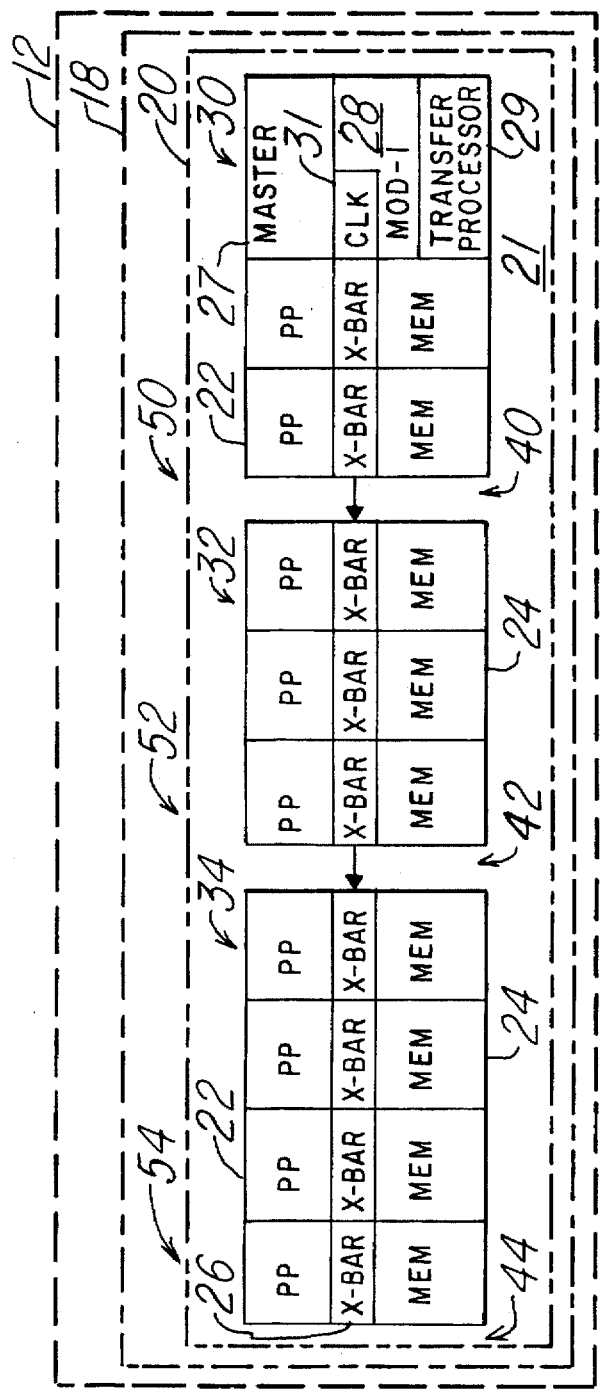
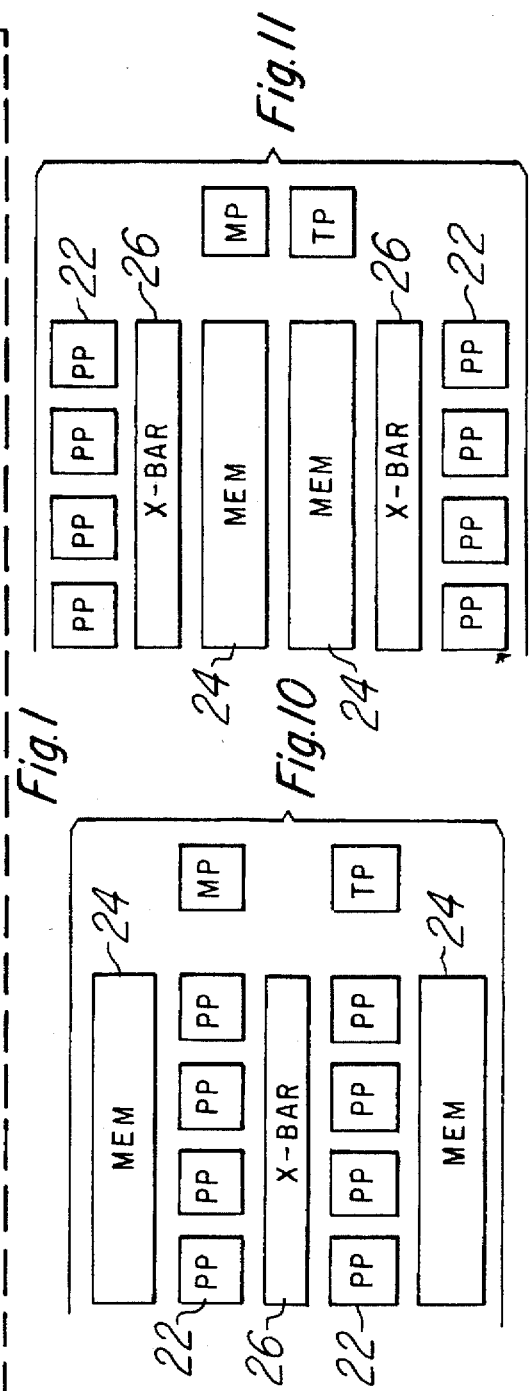

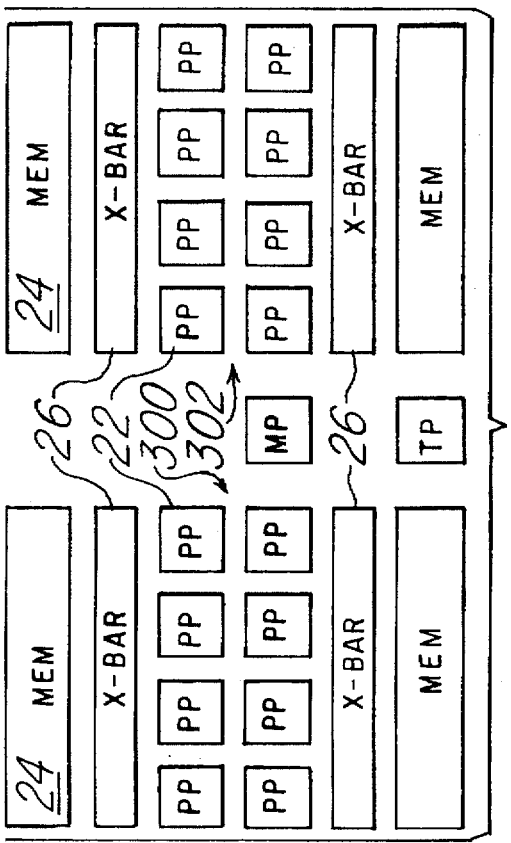
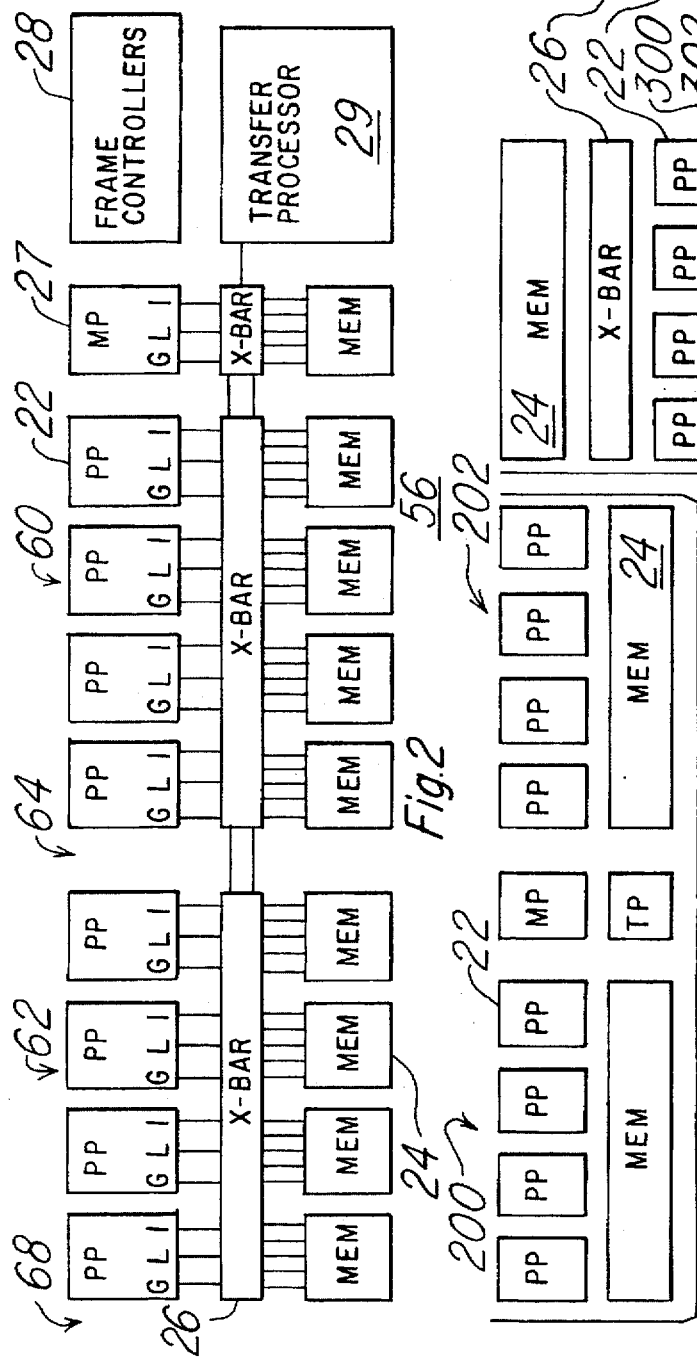
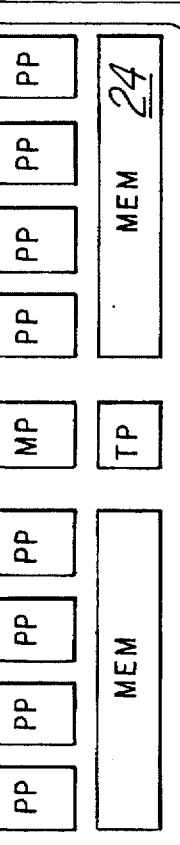

ARCHITECTURE OF A CHIP HAVING MULTIPLE PROCESSORS AND MULTIPLE MEMORIES

This application is: a continuation of U.S. patent application Ser. No. 08/274,132 filed Jul. 12, 1994; which is a continuation of U.S. patent application Ser. No. 07/813,857 filed Dec. 26, 1991 and now abandoned.

TECHNICAL FIELD OF THE INVENTION

This invention relates generally to the architecture of multi-processor systems on a single semiconductor chip, and more particularly to such systems and methods where the several processors are interconnectable to many different memory addressing spaces.

CROSS REFERENCE TO A RELATED APPLICATION

The following U.S. patent application is related to the present invention, it has been assigned to Texas Instruments Incorporated, and it is hereby incorporated by reference in this patent application:

U.S. Pat. No. 5,471,592, entitled MULTI-PROCESSOR WITH CROSSBAR LINK OF PROCESSORS AND METHOD OF OPERATION, based upon U.S. patent application Ser. No. 08/263,504 filed Jun. 21, 1994; which is a continuation of U.S. patent application Ser. No. 08/135,754 filed Oct. 12, 1993 and now abandoned; which is a continuation of U.S. patent application Ser. No. 07/933,865 filed Aug. 21, 1992 and now abandoned; which is a continuation of U.S. patent application Ser. No. 07/435,591 filed Nov. 17, 1989 and now abandoned.

BACKGROUND OF THE INVENTION

In the art of semiconductor chips there is a need for uniformity and modularism among chips of different processing strengths and capabilities. At first, a customer may only be able to afford chips with one or two processors and associated memories. Later, the customer may decide that because of the demands of his own customers, the system he sells needs devices with more processing capability. However, the technology of existing chips will require him to redesign his system, to accomodate more processor chips or a more powerful processor with a different pin-out. Thus, there is a need in the art for modular chips, that is, chips that have the majority of their pin-outs the same whether they contain one processor, or multiple processors.

In the art of semiconductor chips there is also a need for dense packing of processors and memories in a chip. The further apart a processor and an associated memory, the slower the chip. Speed in the existing technology of multi-processor, multi-memory chips is limited by the physical distance between a processor and the memory it shares with the other processors. Thus, there is a need in the art for a multi-processor, multi-memory chip that has more densely packed processors and memories.

The cross-referenced application discloses a multi-link, multi-bus, crossbar switch capable of interconnecting any processor with any memory for the interchange of data. The cross-referenced application also discloses a system which handles multi-processors having multi-memories such that the address space of all of the memories is available to one or more processors concurrently even when the processors are handling different instruction sets. However, the invention of the cross-referenced application suffers from the two deficiencies noted above in the existing technology of semiconductor chips.

The invention overcomes the above-noted and other drawbacks of the prior art by providing a method and apparatus for an integrated circuit having a chip with integrated modular parallelism wherein the integrated circuit has a majority of the same address and data pin-outs for a variable number of processors and memories on the chip.

SUMMARY OF THE INVENTION

An integrated circuit has a semiconductor chip having multiple processors and multiple memories. The chip has an architecture of the processors and memories such that there is at least first and second groups of processors and memories. The first group has at least a first processor and at least a first memory. The second group has at least a second processor and at least a second memory. Each processor is in direct communication with each memory. The architecture has modularity so that the integrated circuit has a majority of the same address and data pin-outs regardless of the number of processors on the chip. In another aspect of the invention, input/output ("I/O") pads can be repositioned, in the design stage of the manufacturing process, to accommodate a new processor count with the same package I/O convention. In another aspect of the invention, processing elements can be easily added or removed in the design stage of the manufacturing process because of the symmetry of the "floor plan" of the integrated circuit. In another aspect of the invention, the architecture has symmetry between the groups, so that when, in the design stage of the manufacturing process, a first part of the chip is flipped over and positioned above a second part of the chip, the processors are facing each other, and the memories are facing each other, or the processors and memories are mirror images of each other.

BRIEF DESCRIPTION OF THE DRAWINGS

The above-noted and other aspects of the present invention will become more apparent from a description of the preferred embodiment, when read in conjunction with the accompanying drawings. The drawings illustrate the preferred embodiment of the invention. In the drawings the same members have the same reference numerals.

FIGS. 1–3 are schematic diagrams depicting the architecture of processors and memories according to the present invention, illustrating symmetry.

FIGS. 7–10 are schematic diagrams depicting the architecture of processors and memories according to the present invention, illustrating symmetry between groups of processors and memories.

DETAILED DESCRIPTION OF THE PREFERRED EMBODIMENTS OF THE PRESENT INVENTION

Figure 3:
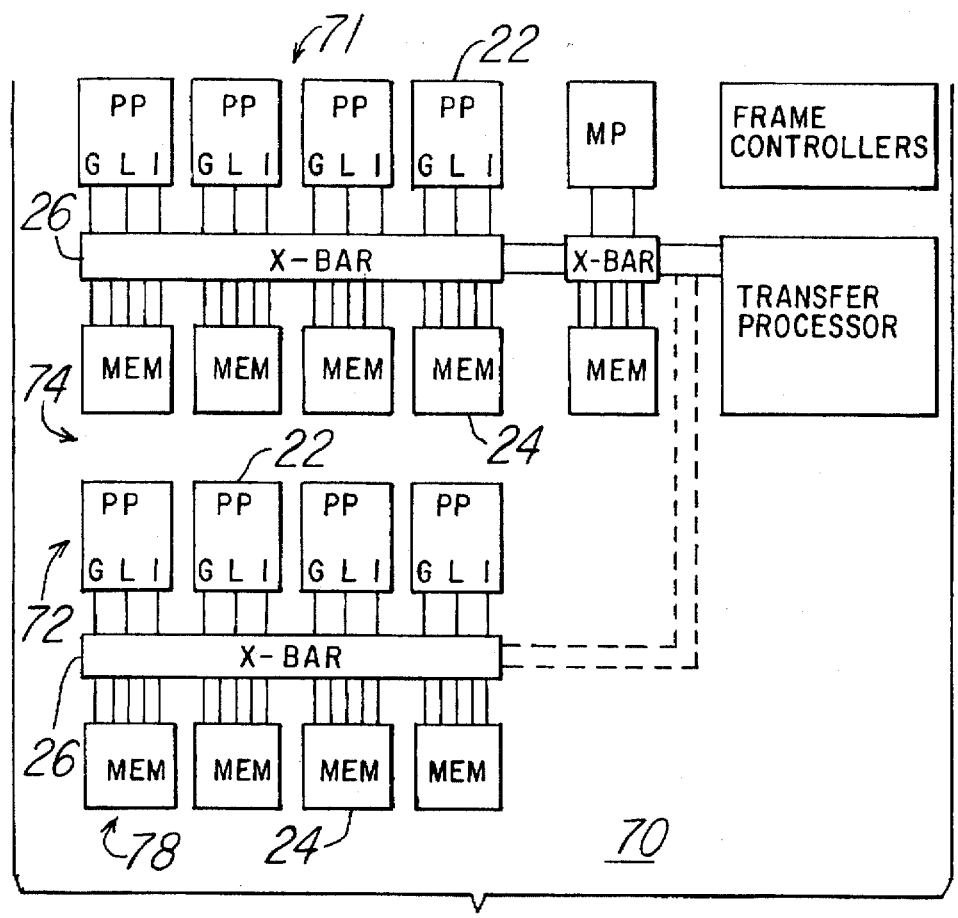

FIG. 1 is a schematic diagram depicting a system 12. The system 12 can be any system that uses an integrated circuit, such as any electronic entertainment device, any industrial equipment, any mainframe computer, minicomputer, personal computer, or workstation. The system 12 contains an integrated circuit 18. The integrated circuit contains a chip 20. FIG. 1 depicts an architecture 21 of the chip 20, illustrating modularity according to the preferred embodiment of the present invention. The architecture 21 contains several groups of processors 22 and memories 24, but only three such groups, 30, 32, and 34, of processors 22 and memories 24, are shown. The architecture 21 is built according to the invention earlier cross-referenced. Therefore, each processor 22 has direct communication with each memory 24, via a crossbar link 26, labeled "X-BAR". The box labeled "MASTER" is a master processor 27 to control the remaining co-processing elements. The box labeled "MOD-1" is a frame controller 28. However, MOD-1 can be any processing element. The frame controller 28 controls display units, such as CRT's and LCD's. The box labeled transfer processor is a transfer/memory processor 29, by which the processors 22 and 27 communicate with external devices, such as other memory, input/output devices, etc. The box labeled "CLK" is a master distributed clock 31 for all processing elements.

The architecture 21 is shown with spaces 40, 42, and 44. However, it is to be understood that these spaces do not exist in the actual hardware, that is, in the physical implementation of the architecture. The spaces are shown to emphasize the modularity of the architecture.

The architecture 21 is modular. That is, the chip 20 is designed for a maximum number of processors 22, but for subsequent redesigns, the architecture 21 depicted in FIG. 1 can be redesigned by simply "slicing" the architecture 21 in the spaces 40, 42, or 44 at the "points" 50, 52, or 54, to quickly and easily produce an architecture for a chip 20 with fewer processors.

For example, if the architecture 21 is sliced at a point 50, the resulting integrated circuit 18 will contain the group 30, which contains one processor 22 and two memories 24. The processor 22 in the group 30 will communicate with the two memories 24 via the portion of the crossbar link 26 remaining in the group 30.

If the architecture 21 is sliced at a point 52, the resulting integrated circuit 18 will contain both the groups 30 and 32, and thus will contain a total of four processors 22 and five memories 24. The processors 22 will communicate with the five memories 24 via the portion of the crossbar link 26 remaining in the groups 30 and 32.

If the architecture 21 is sliced at a point 54, the resulting integrated circuit 18 will contain the groups 30, 32, and 34, and thus will contain a total of eight processors 22 and nine memories 24. The eight processors 22 will communicate with the nine memories 24 via the portion of the crossbar link 26 remaining in the groups 30, 32, and 34.

The groups do not have to be arranged to include the exact number of processors shown. The groups can have any desired number of processors and memories. For example, the groups could be arranged to have in a first group, two processors, and in a second group, two processors, and in a third group, two processors.

The architecture 21 can be sliced to include more processors 22 and memories 24 than are shown in FIG. 1. For example, the architecture 21 could be sliced to include nine processors 22 and ten memories 24, as long as this was less than the maximum number of processors and memories originally designed into the chip 20.

Referring now to FIG. 2, a schematic diagram depicts another architecture 56 of processors and memories according to the preferred embodiment of the present invention.

The box labeled "MP" is a master processor 27. The box labeled "Transfer Processor" ("TP" in other figures) is a transfer processor 29. The box labeled "Frame Controllers" contains frame controllers 28. A group 60 contains four processors 22 and associated memories 24, and a group 62 also contains four processors 22 and associated memories 24. If the architecture 56 is sliced at a point 64, the resulting integrated circuit having the group 60 will have four processors 22. The four processors 22 will communicate with the memories 24 via the crossbar link 26. If the architecture 56 is sliced at a point 68, an integrated circuit having the group 62 will have eight processors 22. The eight processors 22 will communicate with the memories 24 via the crossbar link 26.

Referring now to FIG. 3, a schematic diagram depicts another architecture 70 of processors 22 and memories 24 according to the preferred embodiment of the present invention. A group 71 contains four processors 22 and associated memories 24, and a group 72 also contains four processors 22 and associated memories 24. If the architecture 70 is sliced at a point 74, the four processors 22 will communicate with the memories 24 via the crossbar link 26. If the architecture 70 is sliced at a point 78, the eight processors 22 will communicate with the memories 24 via the crossbar link 26.

Figure 4:
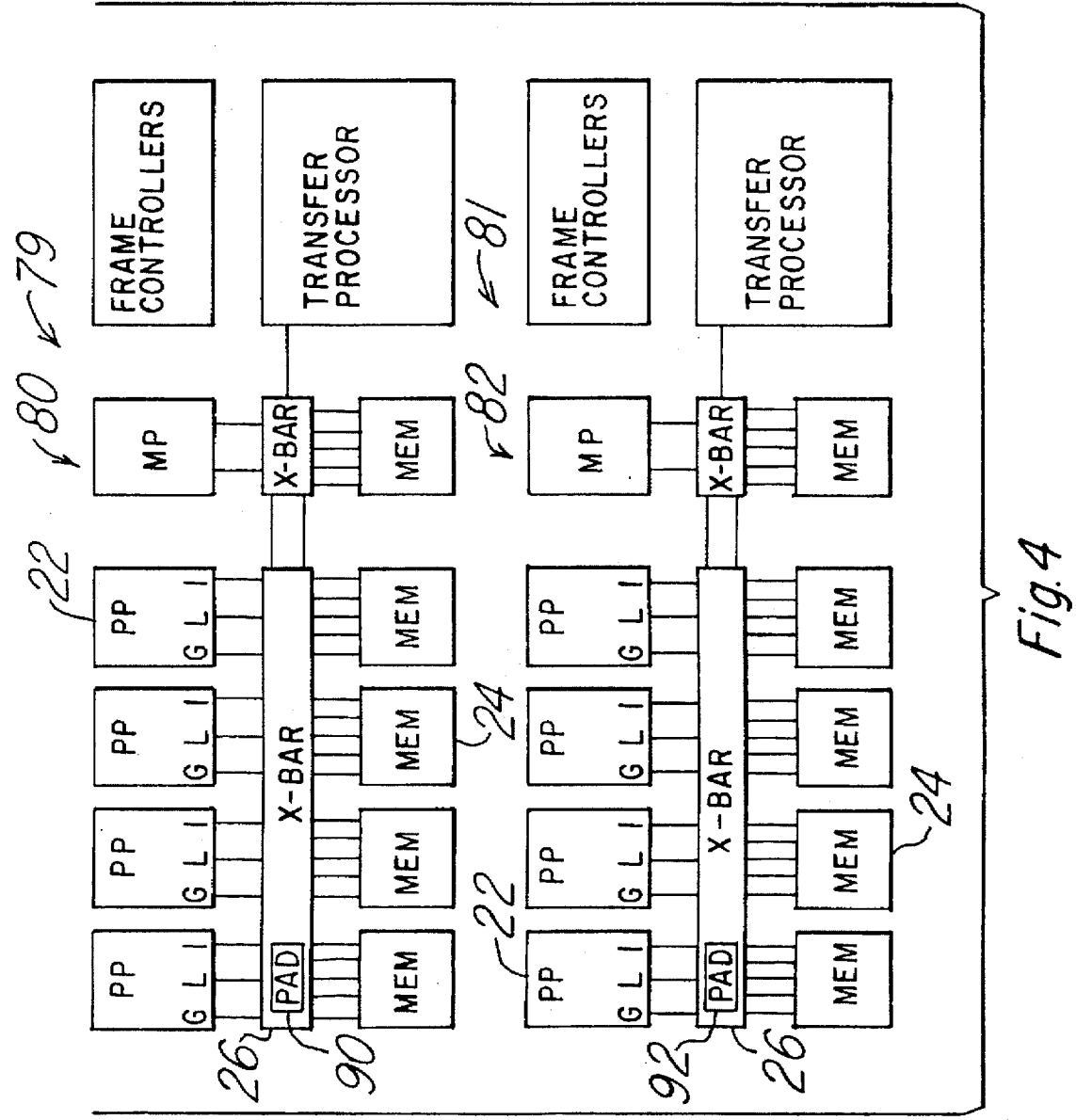
FIGS. 4–5 are schematic diagrams depicting the architecture of processors and memories according to the present invention, illustrating the identical layout in two different groups of processors and memories.

Referring now to FIG. 4, a schematic diagram depicts a design layout 79 of processors 22 and memories 24, illustrating identical groups of processors 22 and memories 24. The design layout 79 for a chip depicts a group 80 which includes four processors and associated memories. A design layout 81 for another chip depicts a group 82 which also includes four processors and associated memories. Design layout 81 may contain all or part of the design layout 79, or may be a mirror image of all or part of the design layout 79.

In the manufacturing stage, a chip containing a part of the design layout 79 can be positioned above a chip containing the design layout 81, so that the two layouts match, or align, thus forming a combination chip. The input/output bonding pads 90 and 92 are bonded together. Such a combination chip allows for denser packing of processors in an integrated circuit, while still maintaining the same pin-outs for the eight-processor combination integrated circuit as for the original four-processor integrated circuit.

Figure 5:
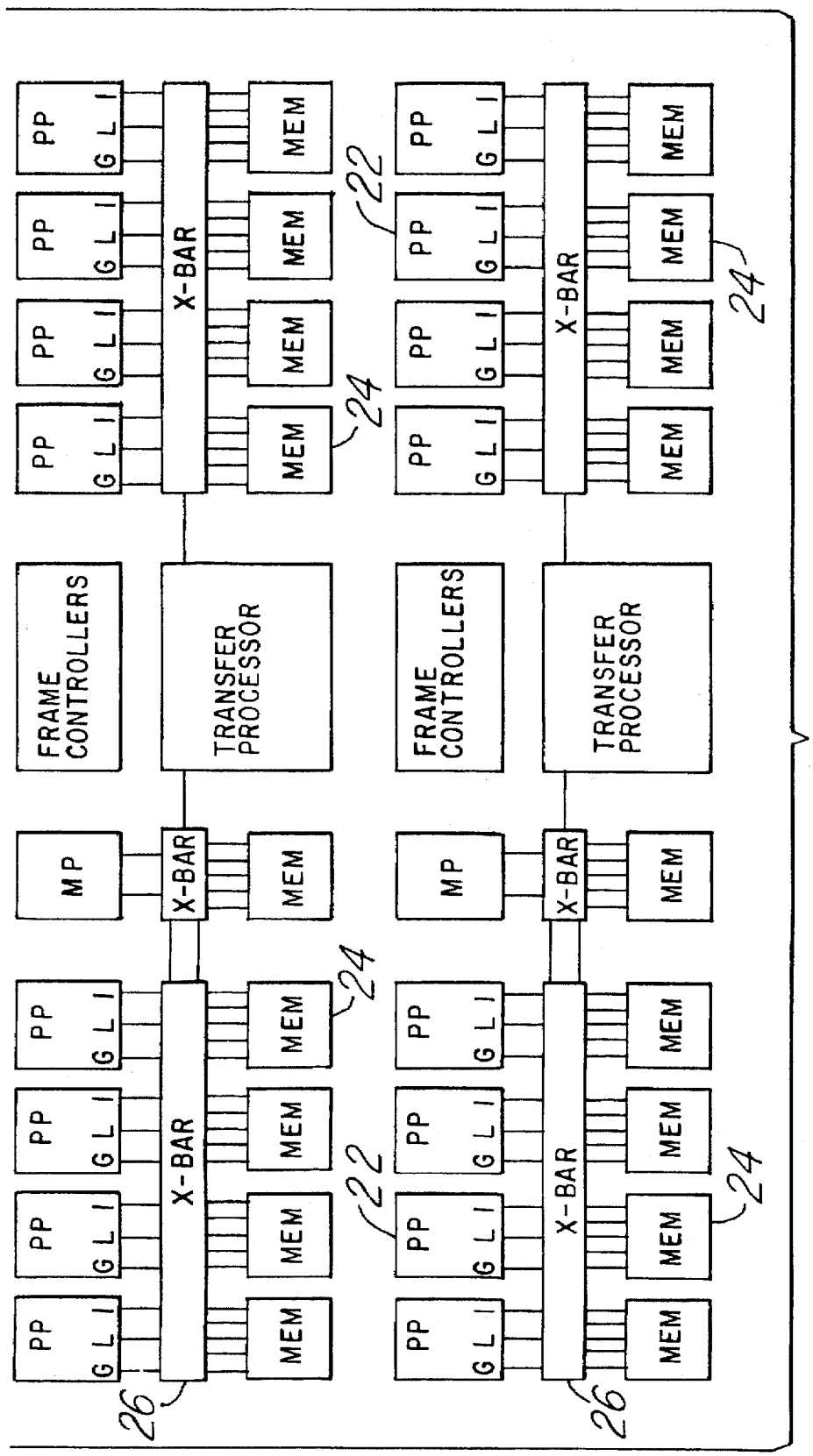

Referring now to FIG. 5, a schematic diagram depicts the architecture of processors 22 and memories 24 according to the preferred embodiment of the present invention, again illustrating identical groups of processors 22 and memories 24. The same method described in relation to FIG. 4 yields for the combination chip of FIG. 5 a densely-packed, sixteen-processor integrated circuit with the same pin-outs as an eight-processor integrated circuit.

Figure 6:
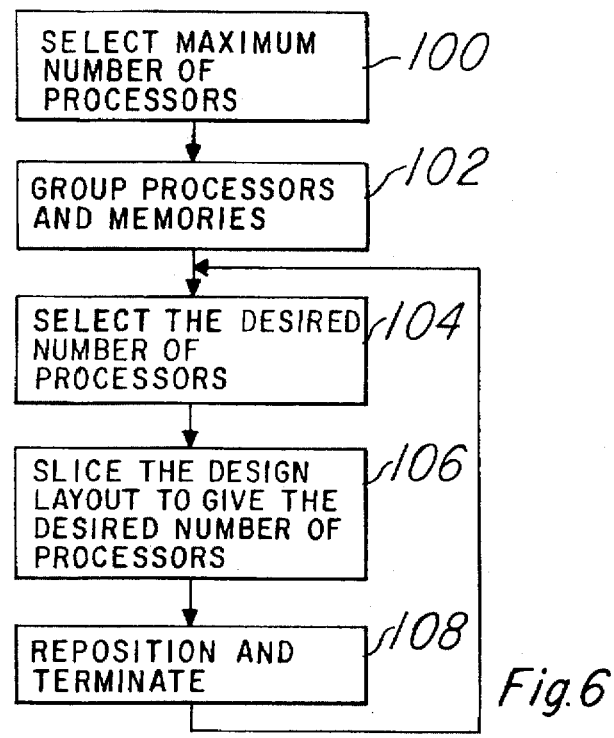
FIGS. 6(a) and 6(b) are flow charts showing part of the manufacturing process according to the method of the present invention.

Referring now to FIG. 6(a), a flow chart illustrates part of the manufacturing process of an integrated circuit according to the method of one of the preferred embodiments of the present invention. As described in relation to FIGS. 1–3, in step 100 an architecture is made, the architecture including at least processors, memories, and a crossbar link. In making the architecture, the manufacturer selects the maximum number of processors desired for a chip. In the preferred embodiment, this number is eight, but it could be sixteen or greater. In this same step, the desired number of memories to be associated with the processors is also selected. In step 102 processors and memories are grouped in the architecture so that each processor is in communication with at least one memory via the crossbar link.

In step 104, the manufacturer decides how many processors and associated memories he wants on a first integrated circuit, such as the one processor of the group 30 in FIG. 1, or the four processors of the groups 30 and 32 in FIG. 1. In step 106, the manufacturer slices the architecture so as to give a layout with the desired number of processors. In step 108 the manufacturer further modifies the architecture by repositioning the input/output bonding pads at the slice point and terminating the crossbar link at the slice point.

Then, the manufacturer repeats steps 104, 106, and 108 for a second integrated circuit, but this time for a different number of processors. Regardless of where the manufacturer slices the original architecture, and thus regardless of the resulting number of processors in the integrated circuit, the integrated circuits will have a majority of the same address and data pin-outs.

Referring now to FIG. 6(b), a flow chart illustrates part of the manufacturing process according to the method of a second preferred embodiment of the present invention, which produces denser packing of processors in an integrated circuit. This preferred embodiment uses a "flipping" technique to make a densely packed integrated circuit. In contrast, the method described in relation to FIG. 4 and FIG. 5 aligns two identical chips. In step 110, as described in relation to FIGS. 1-3, and in relation to FIG. 6(a), the manufacturer makes an architecture and selects the maximum number of processors desired for a chip. In the preferred embodiment, this number is eight, but it could be sixteen or greater. In this same step, the desired number of memories to be associated with the processors is also selected. In step 112 processors and memories are grouped in the architecture so that each processor is in communication with at least one memory via the crossbar link.

Figure 7:
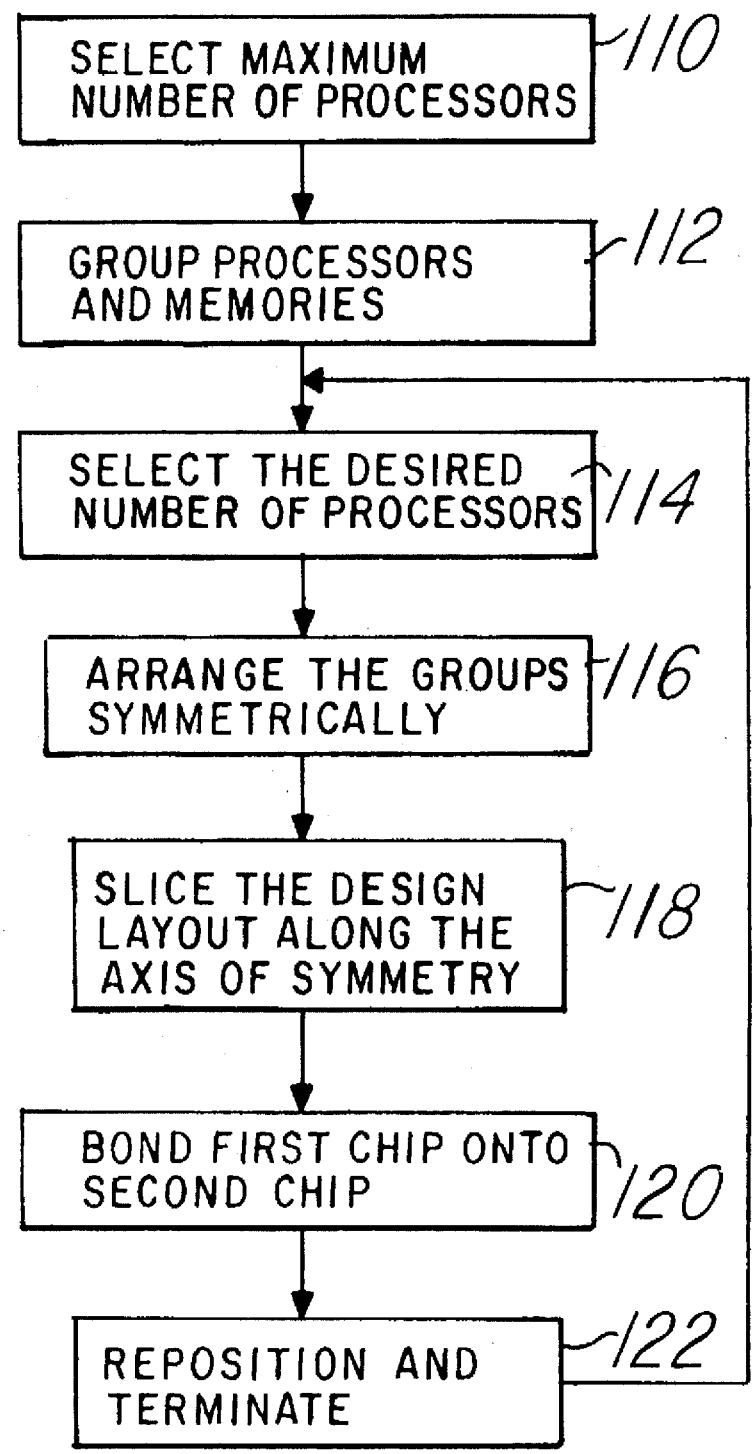

In step 114 the manufacturer decides how many processors and associated memories he wants in a first integrated circuit, such as the eight processors of groups 200 and 202 in FIG. 7, or the sixteen processors of groups 300 and 302 in FIG. 8. In step 116, the manufacturer arranges the groups symmetrically. Examples of symmetrical arrangements of groups are illustrated in FIGS. 7-10. After the groups are arranged symmetrically, then, in step 118, the manufacturer slices the original architecture along the axis of symmetry between the two groups, thus forming the designs for two diferent chips.

In step 120, after the two chips are manufactured, the two chips are bonded to each other, along the axis of symmetry, so that the processors are facing each other, and the memories are facing each other, or so that the groups are mirror images of each other. The resulting design of the first integrated circuit will have a majority of the same address and data pin-outs as an architecture that was not flipped onto itself. For example, referring to FIG. 8, when group 302 is flipped over onto group 300, the resulting architecture will have a majority of the same address and data pin-outs as an architecture that used only group 300 or only group 302. This allows for denser packing of processors in an integrated circuit, thus keeping the distances short between any processor and all the memories. This is important, because the integrated circuit is manufactured according to the cross-referenced invention, wherein each processor is in direct communication with all the memories. In step 122 the manufacturer further modifies the architecture by repositioning the input/output bonding pads at the slice point and terminating the crossbar link at the slice point.

Then, the manufacturer repeats steps 114 through 122 for a second integrated circuit, but this time for a different number of processors. Regardless of where the manufacturer slices the original architecture, and thus regardless of the resulting number of processors in the integrated circuit, the integrated circuits will have a majority of the same address and data pin-outs.

Referring now to FIGS. 7-10, schematic diagrams depict various possible architectures of processors and memories according to the second preferred embodiment of the present invention, illustrating symmetry between groups of processors and memories. The method of the second preferred embodiment of the present invention is not limited to just the symmetrical arrangements shown in FIGS. 7-10. Rather, any symmetrical arrangement may be used.

The principles, preferred embodiment, and modes of operation of the method of the present invention have been described in the foregoing specification. The invention is not to be construed as limited to the particular forms disclosed, because these are regarded as illustrative rather than restrictive. Moreover, variations and changes may be made by those skilled in the art without departing from the spirit of the invention.

What is claimed is:

1. A method of manufacturing integrated circuits using semiconductor chips, comprising the steps of:

a. making an architecture having multiple instances of a modular unit including a processor, a memory and a crossbar link disposed therebetween, said crossbar links of said modular units connected together providing direct communication between any processor and any memory of a predetermined maximum number of said multiple modular units, and having input/output pads for connecting said architecture to external circuits;

b. grouping said modular units into at least first and second groups, including in each group at least one of said modular units;

c. selecting a first desired number of modular units for a first integrated circuit;

d. slicing said architecture between any two groups, to give said selected number of modular units;

e. repositioning said input/output pads;

f. terminating said connection between crossbar links at said slicing between said two groups;

g. constructing an integrated circuit having said selected first desired number of modular units, said constructing step including 1. disposing a first subset of said selected first desired number of modular units on a first semiconductor chip and a second subset of said selected first desired number of modular units on a second semiconductor chip, and 2. bonding said first and second semiconductor chips together by connection of said crossbar links of a predetermined modular unit disposed on said first semiconductor chip and a predetermined modular unit disposed on said semiconductor second chip; and h. repeating steps d, e, f and g for a second desired number of modular units;

wherein said first desired number of modular units is different from said second desired number of modular units, and wherein said integrated circuits have a majority of the same address and data pin-outs, regardless of said number of modular units chosen.

2. The method of claim 1 including the further step of arranging placement of said groups so that said groups are symmetrical.

3. The method of claim 2 wherein said symmetry is arranged so that if a first part of said architecture is flipped over onto a second part of said architecture, said processors are facing each other, and said memories are facing each other.

4. The method of claim 2 wherein said symmetry is arranged so that if a first part of said architecture is flipped over onto a second part of said architecture, said groups are mirror images of each other.

5. The method of claim 1 wherein said step of making said architecture further includes making a nonmodular unit to be included in every integrated circuit manufactured.

6. The method of claim 5 wherein said nonmodular unit includes a master processor, a master memory and a master crossbar link disposed therebetween and connected to said crossbar link of an adjacent modular unit, said master crossbar link and said crossbar links of said modular units together providing direct communication between said master processor and said master memory and any memory of a predetermined number of said multiple modular units, and further providing direct communication between said processor of any modular unit and said master memory.

7. The method of claim 6 wherein said nonmodular unit includes a transfer/memory controller connected to said master crossbar link and to at least one external device, said transfer processor providing communication between said master processor, said processors of each modular unit and said at least one external device.

8. The method of claim 5 wherein said nonmodular unit includes a frame controller.

9. The method of claim 5 wherein said nonmodular unit includes a master clock distributed to all portions of said integrated circuit.

* * * * *